US011168390B2

(12) United States Patent
Yang et al.

(10) Patent No.: US 11,168,390 B2
(45) Date of Patent: Nov. 9, 2021

(54) FACILE METHOD FOR THE LARGE AREA SYNTHESIS OF GEOMETRICALLY TWO DIMENSIONAL METALS AND CERAMICS

(71) Applicant: City University of Hong Kong, Kowloon (HK)

(72) Inventors: Yong Yang, Kowloon (HK); Tianyu Wang, Kowloon (HK); Zhaoyi Ding, Kowloon (HK); Quanfeng He, Kowloon (HK)

(73) Assignee: City University of Hong Kong, Kowloon (HK)

( * ) Notice: Subject to any disclaimer, the term of this patent is extended or adjusted under 35 U.S.C. 154(b) by 247 days.

(21) Appl. No.: 16/420,020

(22) Filed: May 22, 2019

(65) Prior Publication Data

US 2020/0370160 A1   Nov. 26, 2020

(51) Int. Cl.
*B82B 3/00* (2006.01)
*C23C 14/02* (2006.01)
*C23C 14/00* (2006.01)
*C23C 14/35* (2006.01)

(52) U.S. Cl.
CPC .......... *C23C 14/028* (2013.01); *B82B 3/0023* (2013.01); *C23C 14/0005* (2013.01); *C23C 14/35* (2013.01)

(58) Field of Classification Search
None
See application file for complete search history.

(56) References Cited

U.S. PATENT DOCUMENTS

| 2009/0075142 | A1* | 3/2009 | Taylor | H01M 4/8605 |
| | | | | 429/424 |
| 2016/0340533 | A1* | 11/2016 | Casiraghi | C01G 41/00 |

* cited by examiner

*Primary Examiner* — Jason Berman
(74) *Attorney, Agent, or Firm* — Norton Rose Fulbright US LLP

(57) ABSTRACT

A new technique, referred to as PSBEE, is disclosed and enables fabrication of freestanding nanomembranes. The PSBEE technique enables fabrication and synthesis of nanomembranes comprising 2D high entropy alloys and 2D metallic glasses and may be extended to ceramics and semiconductors, thereby enabling the fabrication of large-scale freestanding nanomembranes across a wide range of materials, including those deemed to have a great potential for future functional and structural use. To form nanomembranes using PSBEE, a plurality of membranes may be prepared and subjected to thermoplastic compression. Afterwards, one of the membranes may be removed and the remaining membranes may undergo additional thermoplastic compression in the presence of a Si substrate. Once a threshold level of smoothness is achieved, a coating or film may be applied and then separated from the final plate.

22 Claims, 10 Drawing Sheets

FACILE METHOD FOR THE LARGE AREA SYNTHESIS OF GEOMETRICALLY TWO DIMENSIONAL METALS AND CERAMICS

TECHNICAL FIELD

The present invention relates generally to nanomaterial technologies and, more particularly, to methods for fabricating free-standing nanomembranes.

BACKGROUND OF THE INVENTION

Classic metallurgy has been historically based on bulk metals while the rise of nanotechnology recently has been propelled by the synthesis of metal nanowires, also known as one dimensional (1D) metals. However, synthesis of freestanding metal nanomembranes (the so-called 2D metals) has been limited to a few pure metals and their in-plane dimensions are restricted to the micrometer range.

BRIEF SUMMARY OF THE INVENTION

In the present disclosure, techniques for forming or synthesizing freestanding nanomembranes are disclosed. The disclosed techniques utilize controlled mechanical cleavage along a metal-hydrogel interface to synthesize the nanomembranes, which may be as chemically complex as their bulk counterparts. More importantly, these nanomembranes may have a macroscopic in-plane dimension, possessing an extremely large aspect (width-to-thickness) ratio ranging from 105 to 107. The disclosed technique, referred to as polymer surface buckling enabled exfoliation (PSBEE) has been proven to successfully synthesize a variety of metallic nanomembranes with complex chemical compositions, such as two dimensional (2D) high entropy alloys and 2D metallic glasses. Additionally, the PSBEE technique may be extended to ceramics and semiconductors, thereby enabling the fabrication of large-scale freestanding nanomembranes across a wide range of materials, including those deemed to have a great potential for future functional and structural use.

To form nanomembranes in accordance with the PSBEE techniques disclosed herein, a plurality of membranes may be prepared. The plurality of membranes may include a polyvinyl alcohol (PVA) membrane, a polytetrafluoroethylene (PTFE) membrane, and one or more polyimide (PI) membranes. A nanoimprint tool may be used to perform thermoplastic compression of the plurality of membranes to produce a composite plate with the PVA membrane in the middle and then a membrane (e.g., the PTFE membrane) may be removed from the composite plate to produce a reduced composite plate.

The reduced composite plate may be provided to the nanoimprint tool with the side having the PVA membrane as the target surface, along with a substrate (e.g., a silicon wafer), and thermoplastic compression of the reduced composite plate and substrate may be performed to form a composite wafer. The composite wafer may be formed such that the PVA membrane and the substrate (e.g., a silicon (Si) wafer) are contacting each other. Subsequently, the reduced composite plate may be separated from the substrate to produce a final plate. The final plate may be inspected to verify that it is sufficiently free from scratches (e.g., no distinct scratches are present). The final plate may be provided to a film deposition device configured to apply a coating or film to a surface of the final plate. In an aspect, the coating may be applied subsequent to the determination that the final plate is sufficiently free from scratches. The coating or film may be separated from the surface of the final plate to form a freestanding nanomembrane. The separation of the coating from the surface of the final plate may be facilitated, at least in part, by a water soluble substrate. For example, one of the membranes utilized in the PSBEE method may be a water soluble substrate, such as the PVA membrane, and the coating or film may be separated the final plate by placing the coated final plate in deionized water, which causes the PVA membrane to swell and wrinkle, and enables the coating or film to be separated from the final plate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present disclosure, reference is now made to the following descriptions taken in conjunction with the accompanying drawing, in which:

FIG. 4B is a high resolution TEM image of a free-standing FeCoNiCrNb0.5 film;

DETAILED DESCRIPTION OF THE INVENTION

Figure 1:
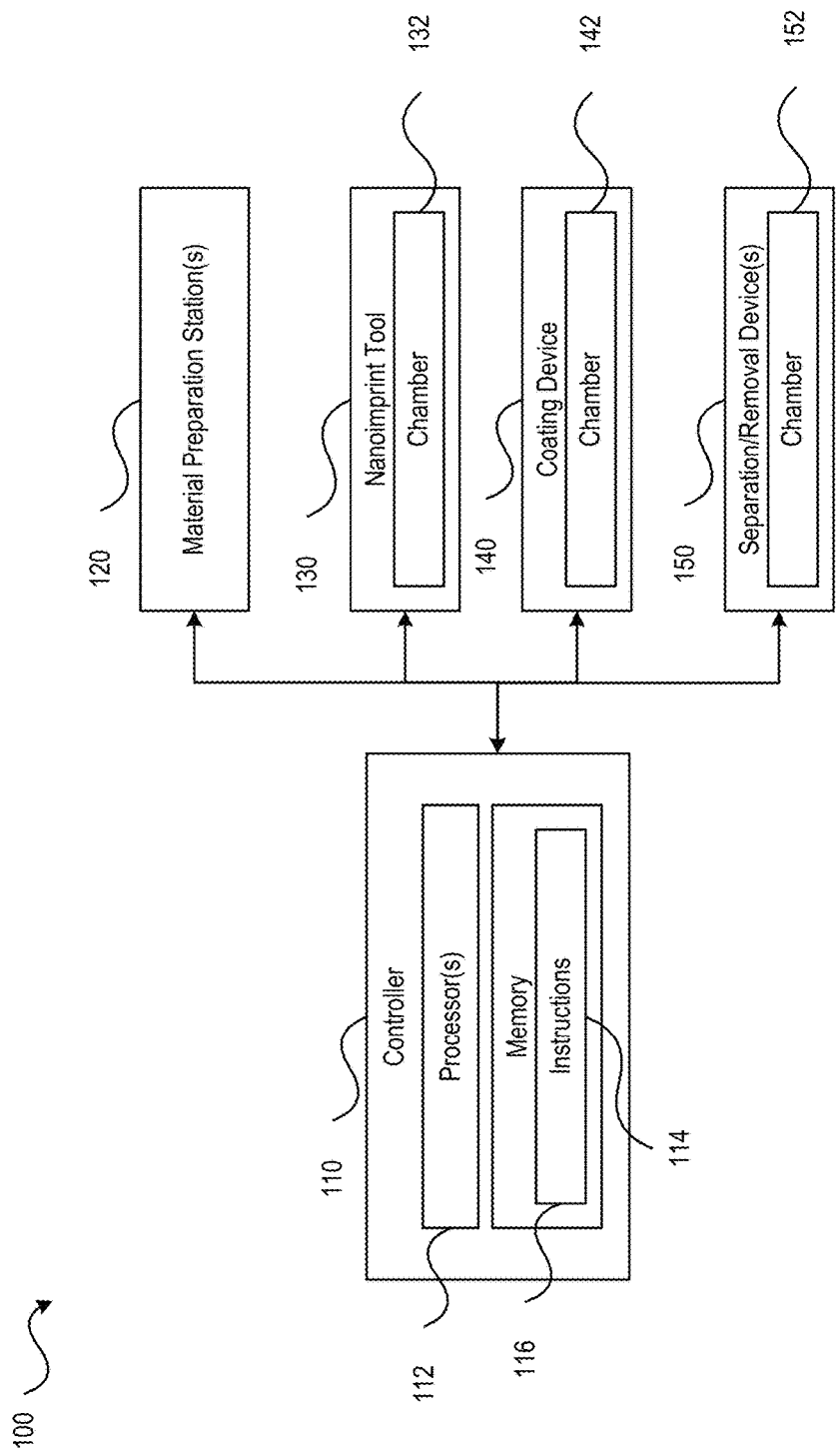
FIG. 1 is a block diagram of a system for performing operations for forming nanomembranes in accordance with embodiments of the present disclosure.

Referring to FIG. 1, a block diagram of a system for performing operations for forming nanomembranes in accordance with embodiments of the present disclosure is shown as a system 100. As described in more detail below, aspects of the PSBEE techniques described herein enable fabrication of freestanding nanomembranes and enable systems for such fabrication to be provided and operated at reduced costs. The PSBEE techniques provided by the system 100 enable fabrication and synthesis of nanomembranes comprising two dimensional (2D) high entropy alloys and 2D metallic glasses and may be extended to ceramics and semiconductors, thereby enabling the fabrication of large-scale freestanding nanomembranes across a wide range of materials, including those deemed to have a great potential for future functional and structural use.

As illustrated in FIG. 1, the system 100 may include a controller device 110, one or more material preparation stations 120, a nanoimprint tool 130, a coating device 140, and a separation/removal device 150. The controller device 110 may include one or more processors 112 and a memory 114. The memory 114 may include read only memory (ROM) devices, random access memory (RAM) devices, one or more hard disk drives (HDDs), flash memory devices, solid state drives (SSDs), other devices configured to store data in a persistent or non-persistent state, or a combination of different memory devices. The memory 114 may store instructions 116 that, when executed by the one or more processors 112, cause the one or more processors 112 to perform the operations described in connection with reference to FIG. 1 and FIG. 7 and as a result, produce various types of nanomembranes, such as the nanomembranes illustrated with reference to FIGS. 2A-6B. The controller device 110 may include a communication interface (not illustrated for simplicity of the figure) that communicatively couples the controller device 110 to one or more other devices of the system 100, such as the one or more material preparation stations 120, a nanoimprint tool 130, a coating device 140, and a separation/removal device 150. The controller device 110 may be configured to control operations of the one or more other devices to facilitate formation of nanomembranes in accordance with embodiments of the present disclosure, as described in more detail below.

To form nanomembranes using the PSBEE techniques described herein, a plurality of membranes may be prepared at the one or more material preparation stations 120. Preparation of the plurality of membranes may include prepare of PVA membrane, a PTFE membrane, diameter, and one or more PI membranes. The PVA membrane may have a diameter between 60 millimeters (mm) and 100 mm and a thickness between 0.1 mm and 2 mm. In an embodiment, the PVA membrane has a diameter of 100 mm and a thickness of less than 1 mm. The PTFE membrane may have a diameter between 60 mm and 100 mm and a thickness between 0.1 mm and 2 mm. In an embodiment, the PTFE membrane has a diameter of 10 mm and a thickness of less than 1 mm. The one or more PI membranes may have any shape with a size that is smaller than the PVA membrane. It is noted, however, that the one or more PI membranes should be thick enough to provide constraint to the PVA swelling when soaked into water. For example, in experiments PI membranes having a thickness of approximately 0.1 mm provided adequate constraint of the PVA membrane. Additionally, the thickness of the PI membranes should take into account compatibility with a nanoimprint system. To accommodate both of these considerations, the PI membranes should have a thickness that is less than 1 mm. The one or more PI membranes may act to constrain and control the expansion of the PVA membrane during processing. It is noted that the one or more PI membranes may be replaced by another non-water-soluble material, such as a silicon (Si) wafer. The plurality of membranes that are prepared may include at least one water soluble membrane, also referred to herein as a water soluble substrate. In an embodiment, the water soluble membrane/substrate may be the PVA membrane. The water soluble membrane/substrate may be configured to absorb water, as described in more detail below.

The plurality of membranes may be prepared or obtained using various methods. For example, the PVA membrane may be fabricated using 3D-printing techniques while the PI and PTFE membranes may be obtained from an external source, such as by being purchased from the supplier. It is noted that previous nanomembrane synthesis techniques used mainly bottom-up wet chemical methods or other minor top-down methods. However, such techniques do not allow the synthesis of large-area nanomembranes and their compatible materials are limited. In contrast to these previous methods, the techniques disclosed herein enable large-area nanomembrane synthesis by exploiting the surface instability and crack propagation between polymers and thin films, as described in more detail below. Nanomembranes synthesized in accordance with the techniques disclosed herein possess exceptionally large aspect ratios and the applicable material(s) may be extended to multicomponent high entropy alloys (HEAs) and metallic glasses, which is impossible for previously utilized methods.

After the materials described above have been prepared, the plurality of membranes may be provided to the nanoimprint tool 130. The nanoimprint tool 130 may be a compact nanoimprint tool provided by NIL Technology or another equivalent hot-pressing system configured to perform the operations described herein with respect to the nanoimprint tool 130. In an embodiment, the providing of the plurality of membranes to the nanoimprint tool 130 may be controlled by the controller device 110. For example, the controller device 110 may be configured to operate one or more robotic arms configured to place the plurality of nanomembranes into a chamber 132 of the nanoimprint tool 130. Additionally or alternatively, the plurality of membranes may be provided to the chamber 132 manually by a user (e.g., a person working in a laboratory or other cleanroom-type environment). The plurality of prepared membranes may be provided to the tool according to a membrane sequence that specifies an order in which the plurality of membranes are placed within the chamber 132 of the nanoimprint tool 130. The order may be specified from top to bottom and may indicate that the PTFE membrane is provided as a bottom layer, the PVA membrane is provided as a middle layer, and the PI layer is provided as a top layer. Alternatively, the order for providing the plurality of membranes to the nanoimprint tool may be specified from bottom to top and may indicate that the PTFE membrane is provided as the bottom layer, the PVA membrane is provided as the middle layer, and the PI layer is provided as the top layer. Once the plurality of membranes are provided to the chamber 132 of the nanoimprint tool 130, the nanoimprint tool 130 may initiate operations for performing thermoplastic compression of the plurality of membranes. Thermoplastic compression of the plurality of membranes may be performed for a threshold period of time at a predetermined temperature and pressure. The threshold period of time may be at least 10 seconds. The predetermined temperature may be between 130° C. and 200° C. The predetermined pressure may be between 3 and 8 bar. In an embodiment, operation of the nanoimprint tool 130 to perform thermoplastic compression of the plurality of membranes may be controlled by the controller device 110. For example, the controller device 110 may be configured to control the temperature, pressure, and time for which the thermoplastic compression is performed.

Thermoplastic compression of the plurality of membranes may produce a composite plate. Upon completing thermoplastic compression, the composite plate may be removed from the chamber 132. In an aspect, removal of the composite plate may be controlled by the controller device 110, such as by controlling a robotic arm to retrieve the composite plate from the chamber 132. Alternatively, the composite plate may be removed manually by a user (e.g., a person working in a laboratory or other cleanroom-type environment). Once removed from the chamber 132, a membrane may be removed from the composite plate to produce a reduced composite plate. For example, the PTFE membrane may be removed such that the reduced composite plate includes the PVA membrane and the one or more PI membranes. The PTFE membrane acts as a non-stick interlayer and may be easily removed from the surface of the PVA membrane, such as by tearing or peeling the PTFE membrane from the PVA membrane.

Following removal of the membrane, the reduced composite plate may be placed in the chamber 132 of the nanoimprint tool 130. As described above, placement of the reduced plate into the chamber 132 may be performed by a robotic arm under the control of the controller device 110 or may be performed manually by a user (e.g., a person working in a laboratory or other cleanroom-type environment). The reduced plate may be placed in the chamber 132 with a Si wafer according to a second sequence. The second sequence may specify whether the Si wafer is to be placed on top of the reduced plate or on bottom of the reduced plate. The second sequence may indicate the reduced composite plate is to be placed on top of the Si wafer (e.g., top=reduced plate; bottom=Si wafer). Additionally, the sequence may specify an orientation of the reduced plate with respect to the Si wafer. For example, the sequence may indicate that the reduced plate is to be placed on top of the Si wafer and that the PVA membrane of the reduced plate should be facing the Si wafer. Once placed in the chamber 132 according to the second sequence, the nanoimprint tool 130 may be operated to perform thermoplastic compression of the reduced composite plate and the Si wafer. As described above, operation of the nanoimprint tool 130 to perform the thermoplastic compression may be controlled by the controller device 110 (or may be controlled by a user). During thermoplastic compression of the reduced composite plate and the Si wafer may be performed for a second threshold period of time at a second predetermined temperature and a second pressure. The second threshold period of time may be less than 3 minutes. The second predetermined temperature may between 110° C. and 150° C. In an aspect, the second predetermined temperature may be approximately 125° C. The second predetermined pressure may be between 1 and 8 bar.

Thermoplastic compression of the reduced composite plate and the Si wafer may produce a temporary plate. For example, the thermoplastic compression of the reduced composite plate and the Si wafer aims to smoothen a surface of the PVA membrane (e.g., the surface of the PVA membrane that is facing the Si wafer). Upon completing thermoplastic compression, the temporary plate may be removed from the chamber 132, as described above. A final plate may be produced from the temporary plate, such as by removing the Si wafer. For example, after the thermoplastic compression, the final plate may be formed from the temporary plate by removing or separating the reduced composite from the Si wafer. The removal or separation of the reduced composite plate from the Si wafer may be accomplished using techniques similar to removal of the PTFE membrane from the composite plate, as described above. As a result, the final plate may not include or consist of the Si wafer. The final plate may be analyzed to verify that it is properly formed and suitable for further use in forming nanomembranes in accordance with the PSBEE techniques disclosed herein. For example, the final plate may be inspected to determine whether any scratches are present on the final plate. If the final plate is determined to be sufficiently free from scratches, the final plate may be further processed, as described in more detail below. It is noted that a final plate may be determined to be sufficiently free from scratches if there are not distinct scratches found during inspection of the final. When a final plate is determined to be sufficiently free from scratches it may have a mirror-like finish. If the final plate is not found to be sufficiently free from scratches, the final plate may be placed back into the nanoimprint tool 130 and thermoplastic compression may be performed again. This process may be repeated until the final plate is found to be sufficiently free from scratches.

Once formed, the final plate may be provided to the coating device 140. For example, the final plate may be placed within a chamber 142 of the coating device 140. The coating device 140 may be configured to apply a film to the final plate. The coating device 140 may be a magnetron sputtering device or a thermal vapor deposition device. It is noted that other film deposition systems or device may also be used to apply the film to the final plate, such as molecular beam epitaxial devices, multi-arc ion plating devices, and the like. It is noted that the coating should be applied in a manner that keeps the prepared sample cool enough (e.g., less than 65° C.) and the film deposition process should not require the presence of water, which would interact with the PVA membrane and negatively impact the process. In an aspect, the film deposition device may apply the coating under the control of another device, such as the controller 110 of FIG. 1. For example, the controller device 110 may control a thickness of the film applied by the coating device, a rate at which the film is applied, a temperature at which the film is applied, or other aspects of the operations of the coating device 140. Alternatively, the coating device 140 may be controlled and operated by a user, such as by providing inputs to the coating device that control its operations. In an aspect, the coating may be applied subsequent to a determination that the final plate is sufficiently free from scratches. The film applied by the coating device 140 may have a thickness that ranges from nanometers to micrometers. In an aspect, as the film is applied a temperature of the PVA surface of the final plate may be maintained below a threshold temperature. The threshold temperature may be 65° C.

Once the film has been applied to the final plate by the coating device 140, the coated final plate may be removed from the chamber 142 of the coating device 140. As described above, the coated final plate may be removed under the control of the controller device 110 or by a user. Once removed, the coated final plate may be provided to the separation device 150, which may be configured to separate the film applied by the coating device 140 from the final plate yielding a freestanding nanomembrane. Separation of the film coating from the surface of the final plate may be facilitated, at least in part, by the water soluble substrate. For example, to separate the film coating from the surface of the final plate, the final plate (having the surface to which the coating is applied) may be placed in deionized water and a portion of the final plate may absorb the deionized water, causing the portion to swell, which induces surface instability and enables the film or coating to be separated from the final plate. The portion of the final plate may be the water soluble substrate, such as the PVA membrane. When placed in the chamber 152 of the separation device 150, the surface having the film applied thereto may be oriented as the top surface (i.e., the final plate is placed in the chamber 152 with the film facing upward. The water volume should be adequate to enable the PVA membrane to absorb a sufficient quantity of water (depending on the type of selected PVA), such that the PVA membrane swells and induces surface instability, causing separation of the PVA membrane from the film. The environment within the chamber 152 should be kept stable so as to avoid accidental film fracture, which may be caused by water flow.

Once separated from the final plate, the freestanding nanomembrane may be available for further uses and applications, which may vary depending on the particular makeup of the nanomembrane. However, the PSBEE technique for forming nanomembranes disclosed herein facilitates various advantages over previous approaches. For example, while previous techniques were limited to a few pure metals, the PSBEE techniques disclosed herein enable nanomembranes to be formed that are chemically complex, including 21) high entropy alloys and 2D metallic glasses, as well as ceramics and semiconductors. Additionally, while previous approaches to nanomembrane synthesis were limited to the micrometer range, nanomembranes formed in accordance with embodiments of the present disclosure may have a macroscopic in-plane dimension, possessing an extremely large aspect (width-to-thickness) ratio ranging from 105 to 107.

Figure 2A:
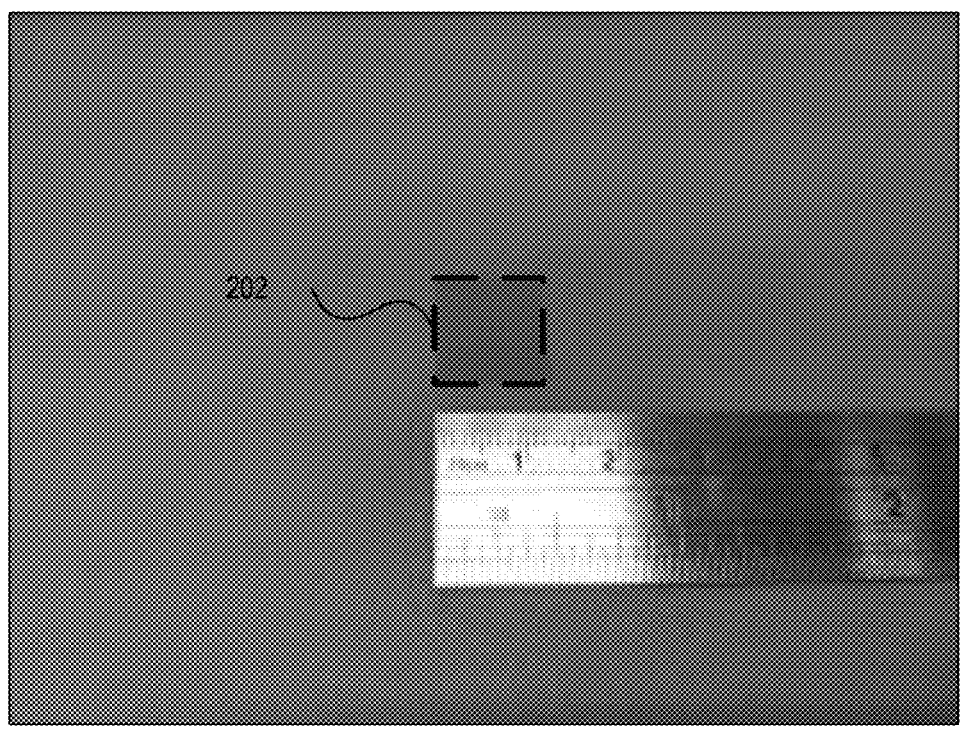
FIG. 2A is an image illustrating a PVA substrate with PI constraint membrane.
Figure 2B:
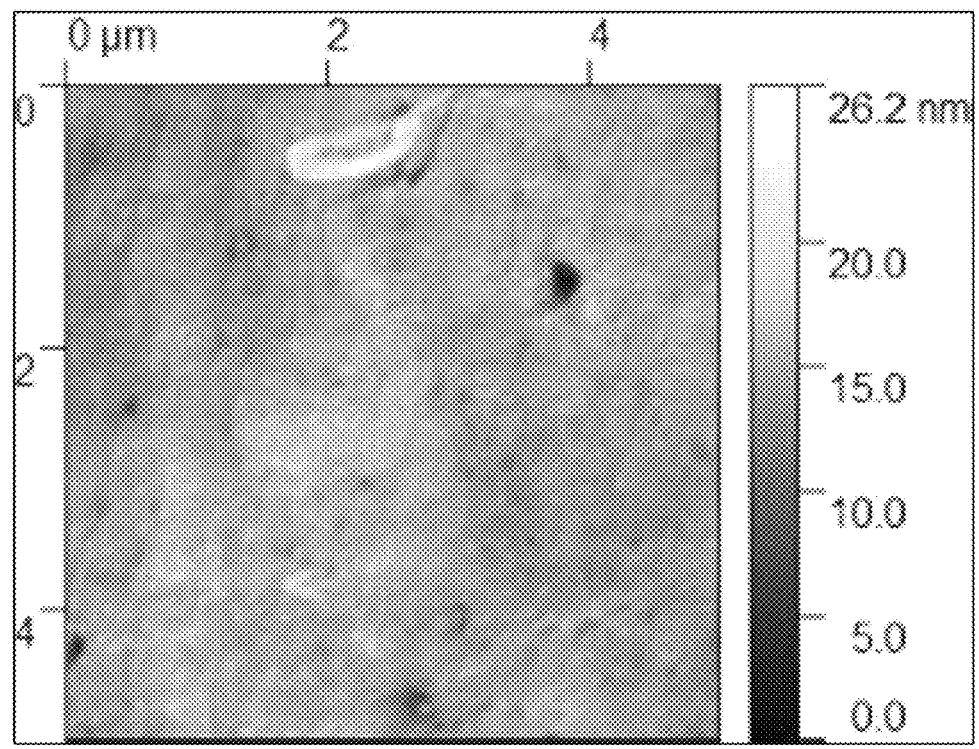
FIG. 2B is an atomic force microscopy (AFM) image of a treated PVA surface.

Referring to FIG. 2A, an image illustrating a PVA substrate with PI constraint membrane is shown in highlight 202. As described above, one or more PI membranes may be utilized to constraint the PVA membrane during thermoplastic compression. As briefly explained above, when the final plate coated with the film is placed in water, the PVA membrane will start to swell. If there are no constraint membranes (e.g., the PI membrane(s)), the swelling is unlimited and may ultimately tear the deposited film into fragments. However, in the presence of the constraint layer (s), a physical phenomenon named surface instability will appear and form a wavy structure on the surface, which testing has shown to be an important factor for the successful exfoliation. Compared to other possible alternatives to using the PI membrane(s) as constraining layers, PI membranes are easy to bend, which aids in bonding the PI membrane(s) to the PVA during the first thermo-compression phase and also facilitates good contact between the PVA target surface and the Si wafer during the second thermo-compression phase. Additional benefits may be realized by the physical and chemical properties of PI membranes, which allow the PI membranes to withstand the high temperatures that may be realized during the PSBEE process disclosed herein, and is stable and will not react with most organic solvents and water. FIG. 2B is an atomic force microscopy (AFM) image of a treated PVA surface formed in accordance with embodiments of the present disclosure. The PVA surface has a roughness of 1.43 nm. It is noted that most scratches may be removed during the thermo-compression phase including the Si wafer, which may result in a PVA membrane surface that is as flat as the Si wafer. For example, the PVA surface may have a root mean square (RMS) roughness of 1.43 nm.

Figure 3A:
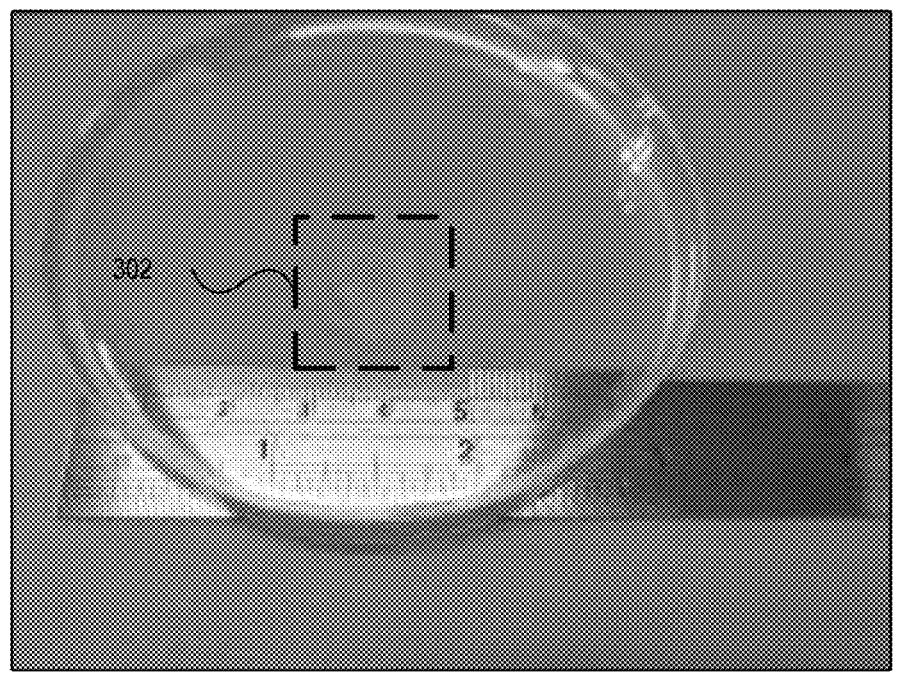
FIG. 3A is an image of a fabricated large-scale freestanding titanium (Ti) film suspended in water.
Figure 3B:
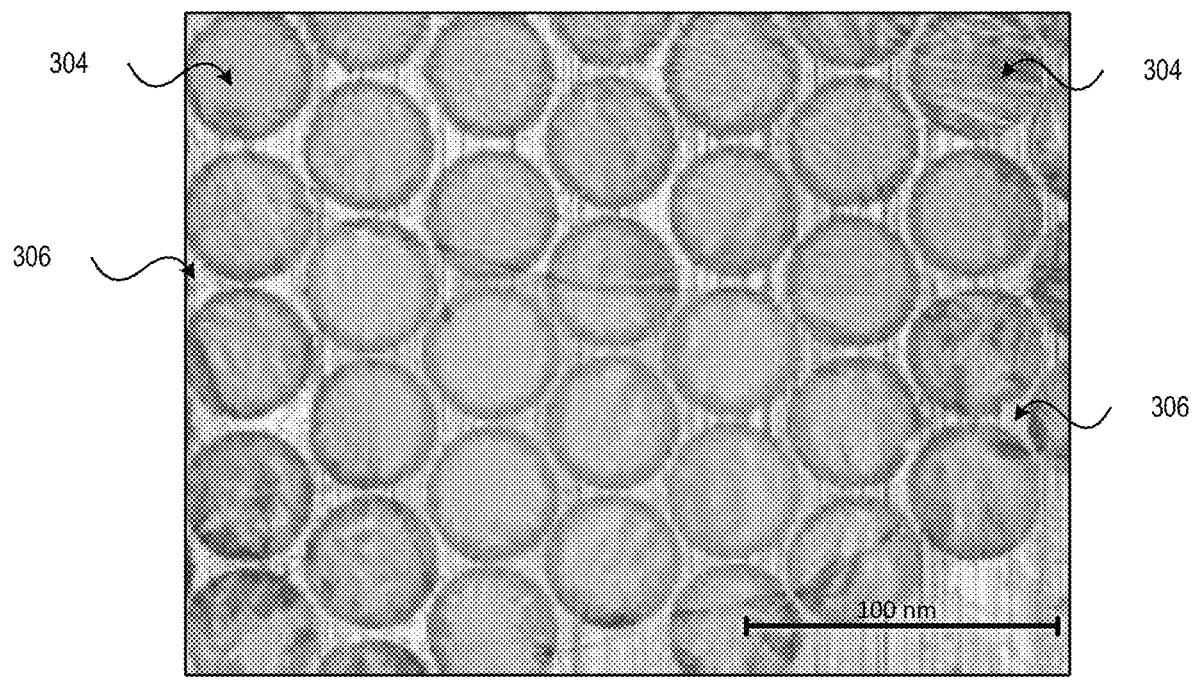
FIG. 3B is an optical microscope image of a Ti film supported by a 300-mesh C-free copper grid.
Figure 3C:
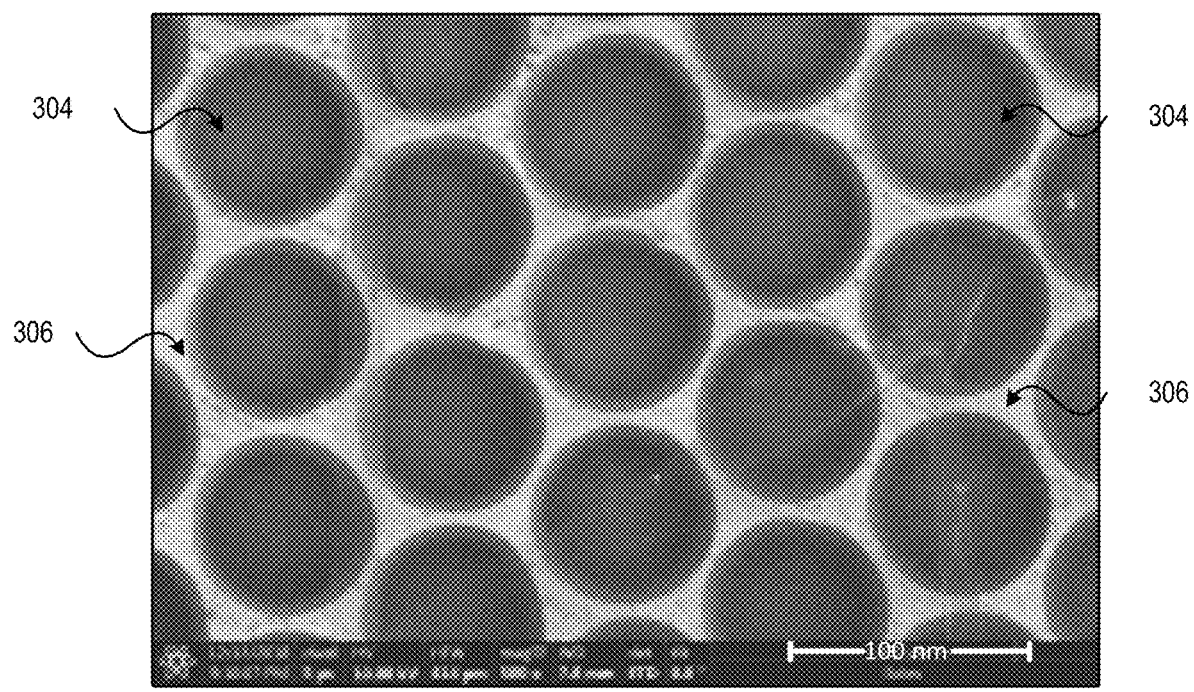
FIG. 3C is a scanning electron microscope (SEM) image of a Ti film supported by a copper grid.
Figure 3D:
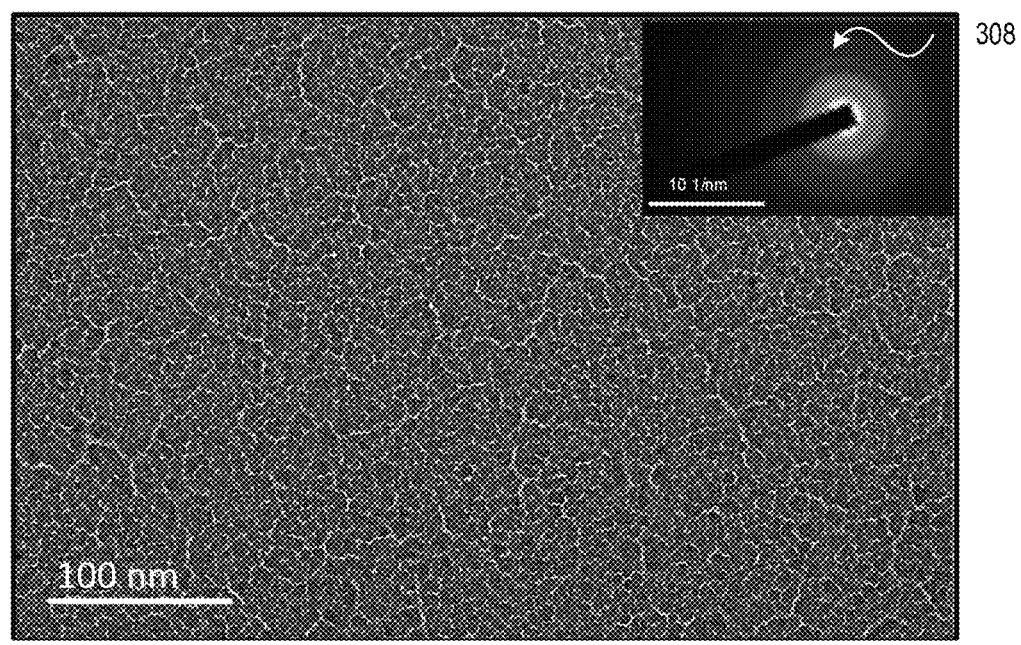
FIG. 3D is a transmission electron microscope (TEM) image including the corresponding diffraction pattern of a fabricated free-standing Ti film.

Referring to FIG. 3A, an image of a fabricated large-scale free-standing Ti film suspended in water is shown in highlight 302. FIGS. 3B and 3C illustrate an optical microscope image and a SEM image, respectively, of a Ti film 304 supported by a 300-mesh copper grid 306. The Ti film is not attached to a carbon film. As previously noted, prior fabrication approaches are not able to synthesize free-standing HEAs and cannot be used with metallic glasses. In contrast, the techniques disclosed herein are capable of synthesizing membranes from free-standing 2D pure metals, such as Ti. As described above, the as-fabricated nanomembrane or film may be suspended in water. To facilitate the subsequent observation and characterization of the nanomembrane, a C-free copper grid (or another technique) may be used collect the film without losing the free-standing characteristics of the film. It is noted that the image shown in FIG. 3C is a 500× magnification of the Ti film. FIG. 3D is a TEM image illustrating a fabricated free-standing Ti film and insert 308 illustrates a diffraction pattern of the Ti film.

Figure 4A:
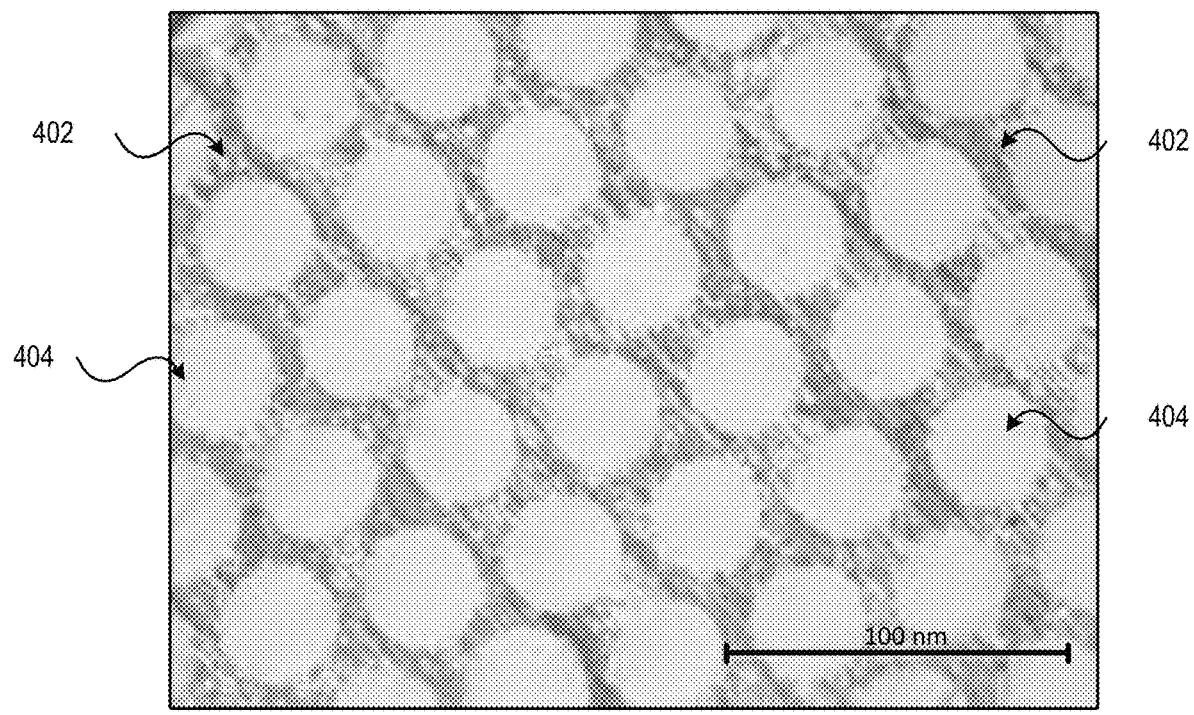
FIG. 4A is an image of an FeCoNiCrNb0.5 Film supported by a 300-mesh C-free copper grid.
Figure 4B:
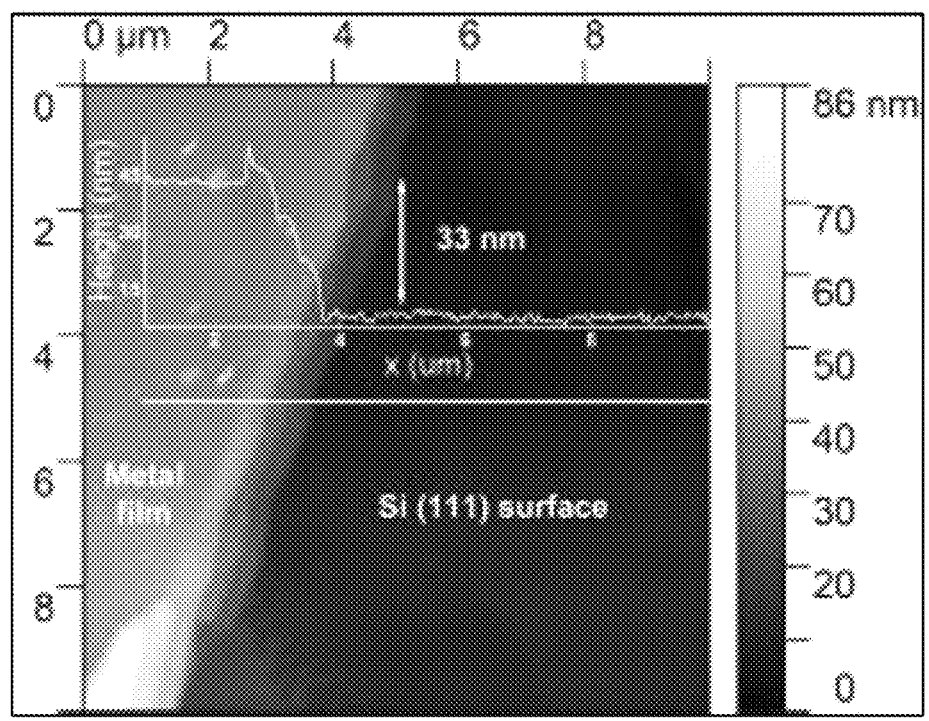
FIG. 4B is an AFM image illustrating aspects of an FeCoNiCrNb0.5 film resting on a Si surface.
Figure 4C:
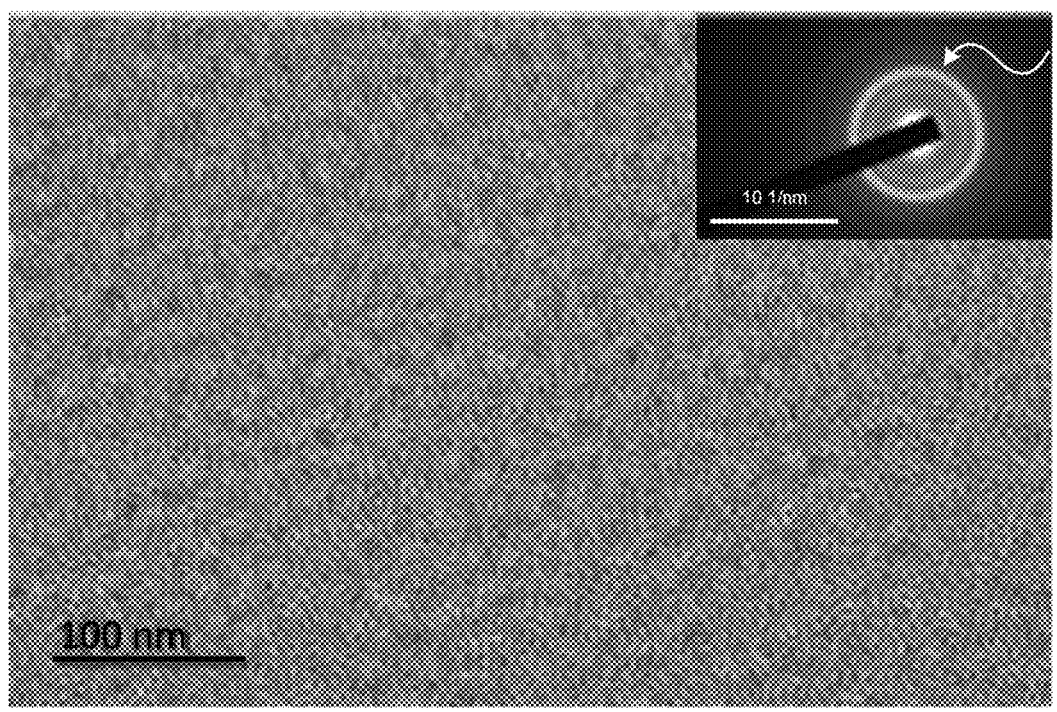
FIG. 4C is a TEM image including the corresponding diffraction pattern of a fabricated free-standing FeCoNiCrNb0.5 film.
Figure 4D:
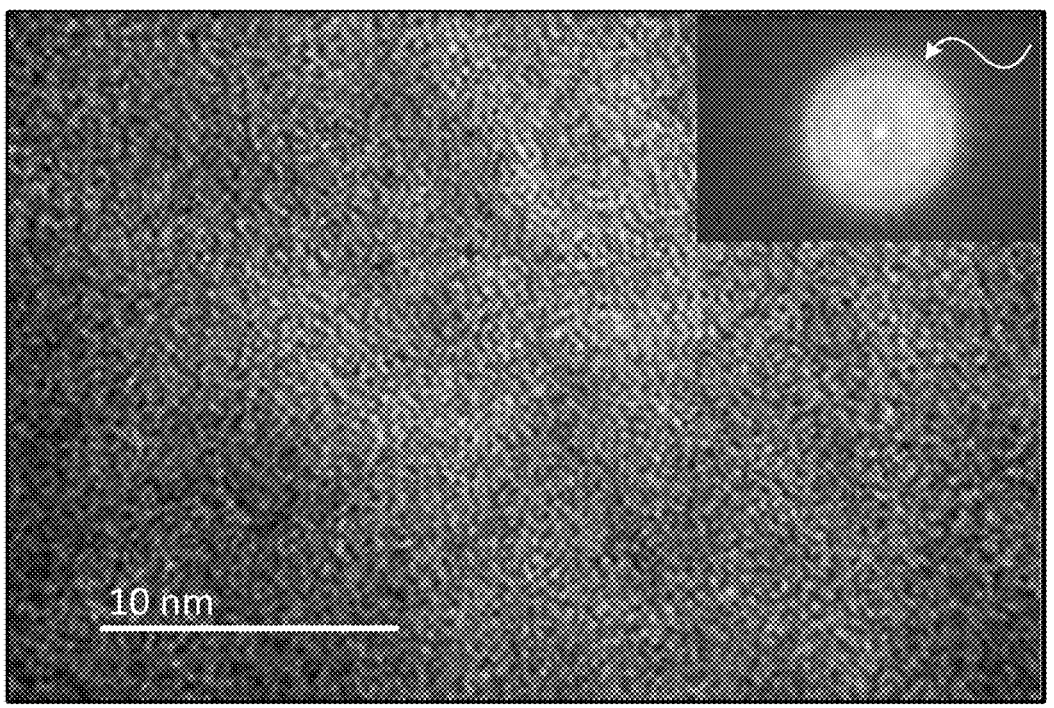

Referring to FIGS. 4A-4D, various images illustrating aspects of an FeCoNiCrNb0.5 film formed using the PSBEE techniques disclosed herein are shown. The image in FIG. 4A shows an FeCoNiCrNb0.5 film 402 supported by a 300-mesh copper grid 404. It is noted that the FeCoNiCrNb0.5 film is not attached to a carbon film. In previous studies, the films fabricated using previous techniques were usually smaller than the holes of the C-free copper gird. As a result, a layer of carbon film was often attached to the copper grid so that the C-film can collect some free-standing film. However, nanomembrane films generated in accordance with the techniques disclosed herein are larger and do not need the C-film to support the film. Furthermore, the presence of a C-film, which may have a thickness of around 20 nm and is usually in amorphous state, disturbs TEM observation. In contrast, nanomembranes generated according to embodiments do not require the C-film, allowing TEM images to directly represent the structure of film. An AFM image illustrating a profile of the FeCoNiCrNb0.5 film resting on a Si surface are shown in FIG. 4B. FIGS. 4C and 4D are TEM images of a fabricated free-standing FeCoNiCrNb0.5 film. In FIG. 4C, highlight 406 illustrates a diffraction pattern of the fabricated free-standing FeCoNiCrNb0.5 film and in FIG. 4D highlight 408 illustrated a fast Fourier transform (FFT) image of the FeCoNiCrNb0.5 film.

Figure 5A:
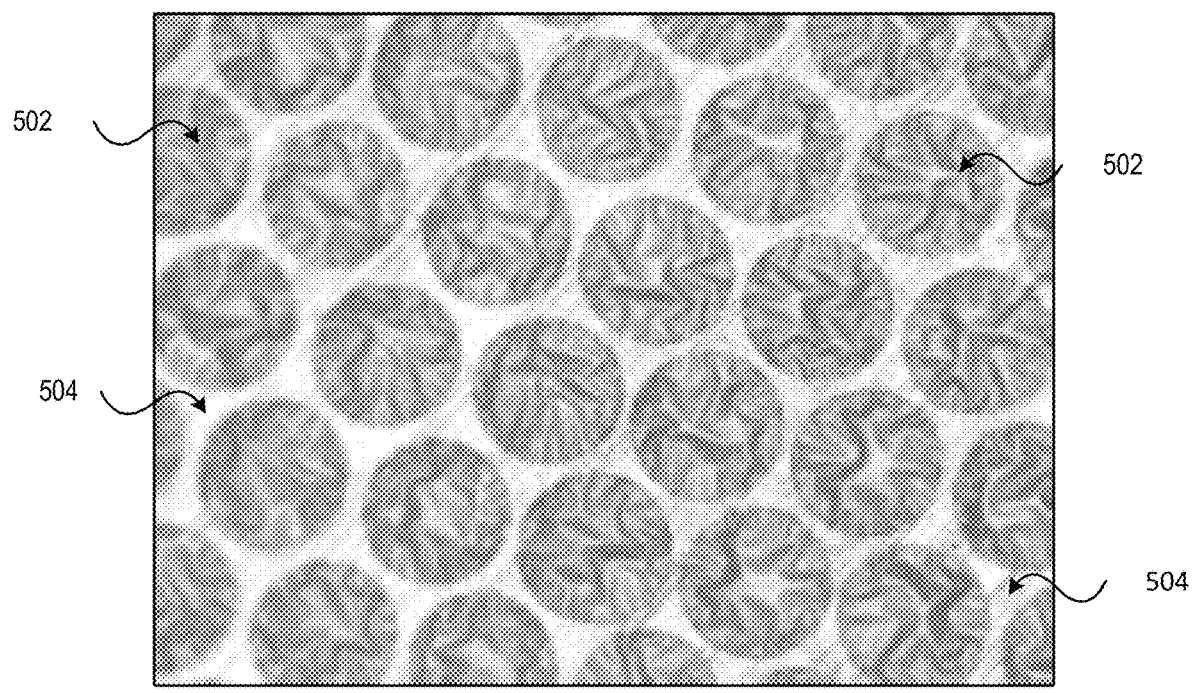
FIG. 5A is an image of a Si film supported by 300-mesh C-free copper grid.
Figure 5B:
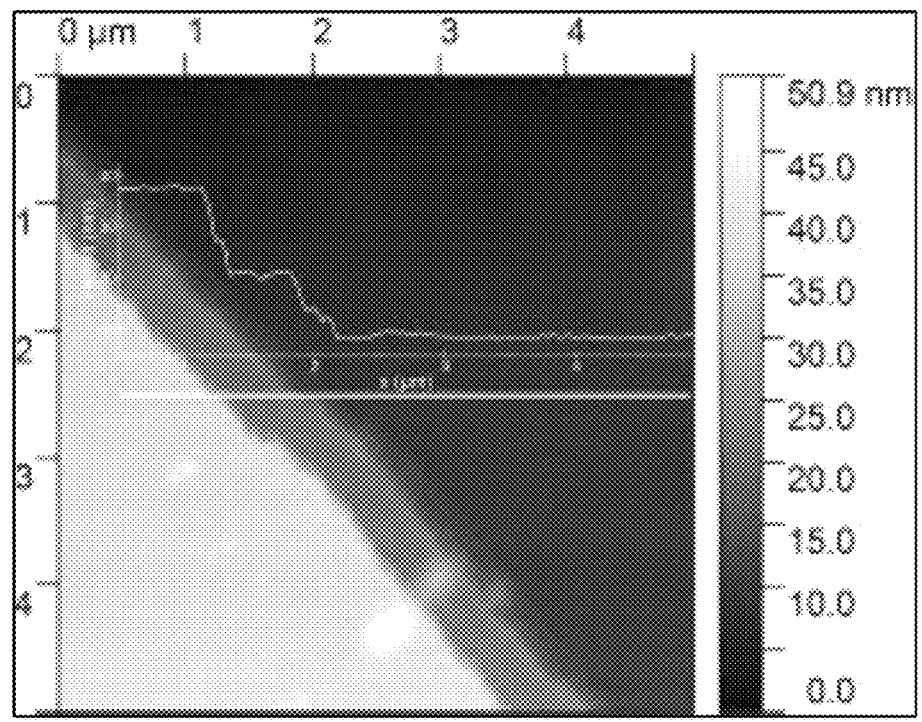
FIG. 5B is an AFM image illustrating aspects of a Si film resting on Si surface.
Figure 5C:
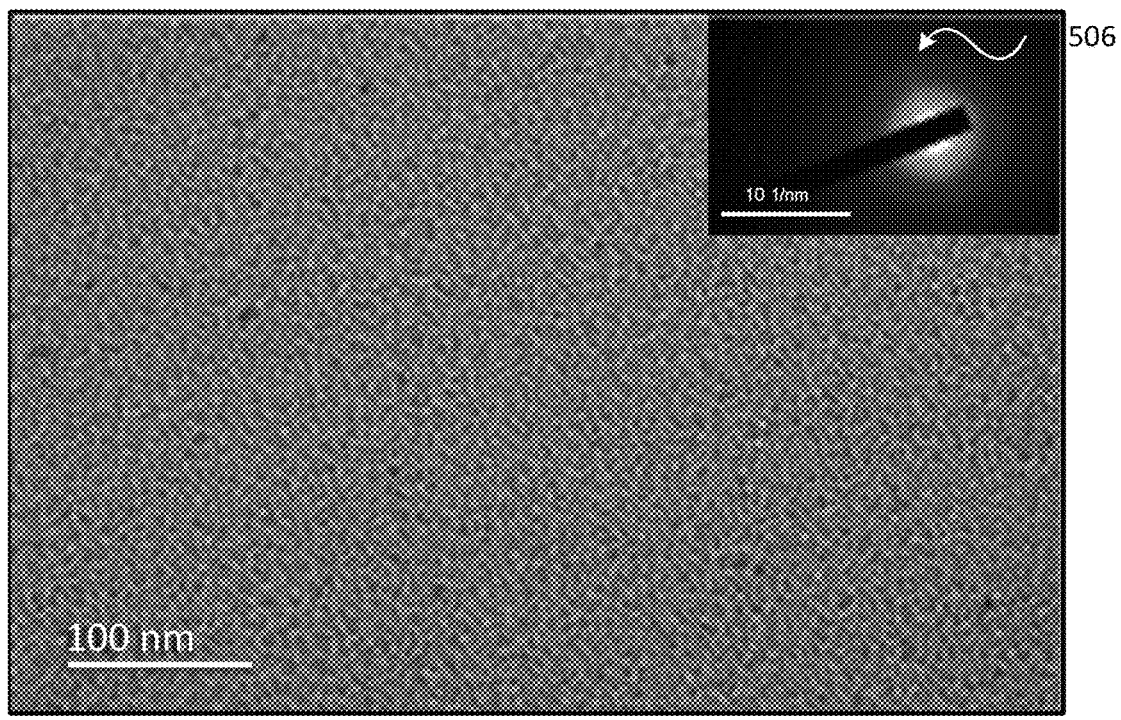
FIG. 5C is a TEM image including the corresponding diffraction pattern of a fabricated free-standing Si film.
Figure 5D:
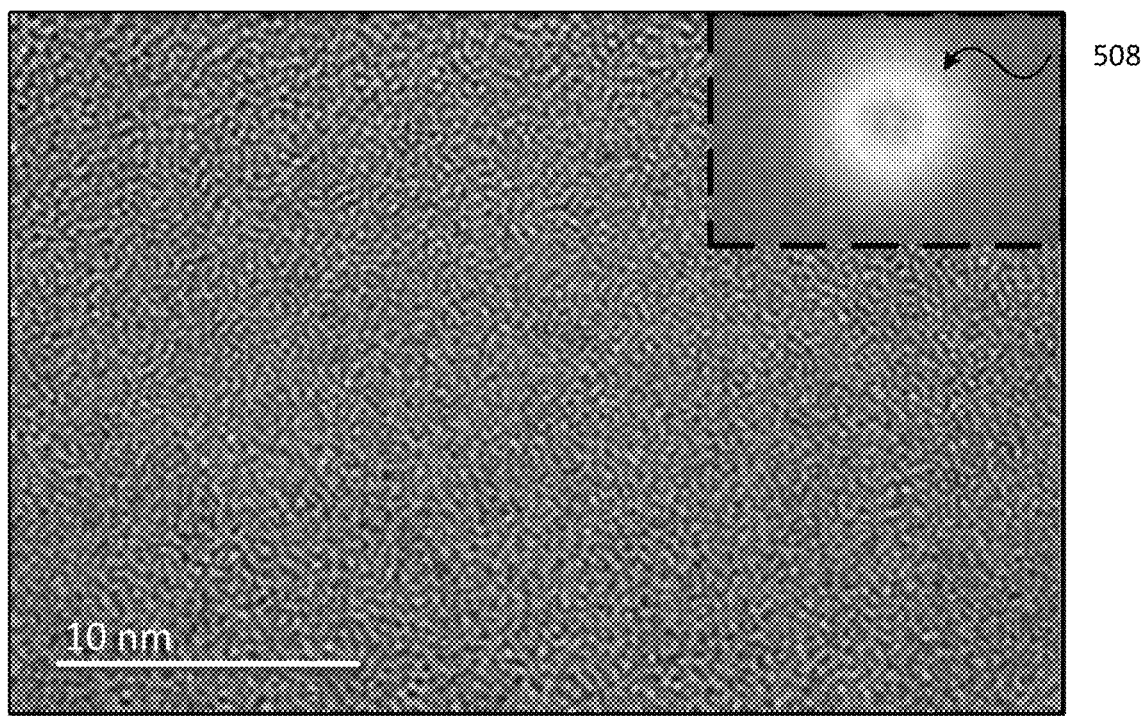
FIG. 5D is a high resolution TEM image illustrating aspects of a free-standing Si film and corresponding FFT image.

Various images of the Si film are shown in FIGS. 5A-5D. In FIG. 5A, an image of the Si film supported by a 300-mesh copper grid (without a carbon film) is shown and FIG. 5B is an AFM image illustrating aspects of the Si film resting on Si surface. A TEM image illustrating a fabricated free-standing Si film is shown in FIG. 5C, wherein highlight 506 illustrates a diffraction pattern of the fabricated free-standing Si film. As described above, previous approaches required the use of a C-film to retrieve and study a film, but embodiments enable synthesis of a film that is capable of being studied and retrieved without the underlying C-film, which enables PSBEE membrane films to be more accurately analyzed (e.g., using TEM imaging). A high resolution TEM image illustrating aspects of a free-standing Si film are shown in FIG. 5D, where highlight 508 illustrates an FFT of the image. The FFT provides information about the film in a similar manner to the diffraction pattern.

Figure 6A:
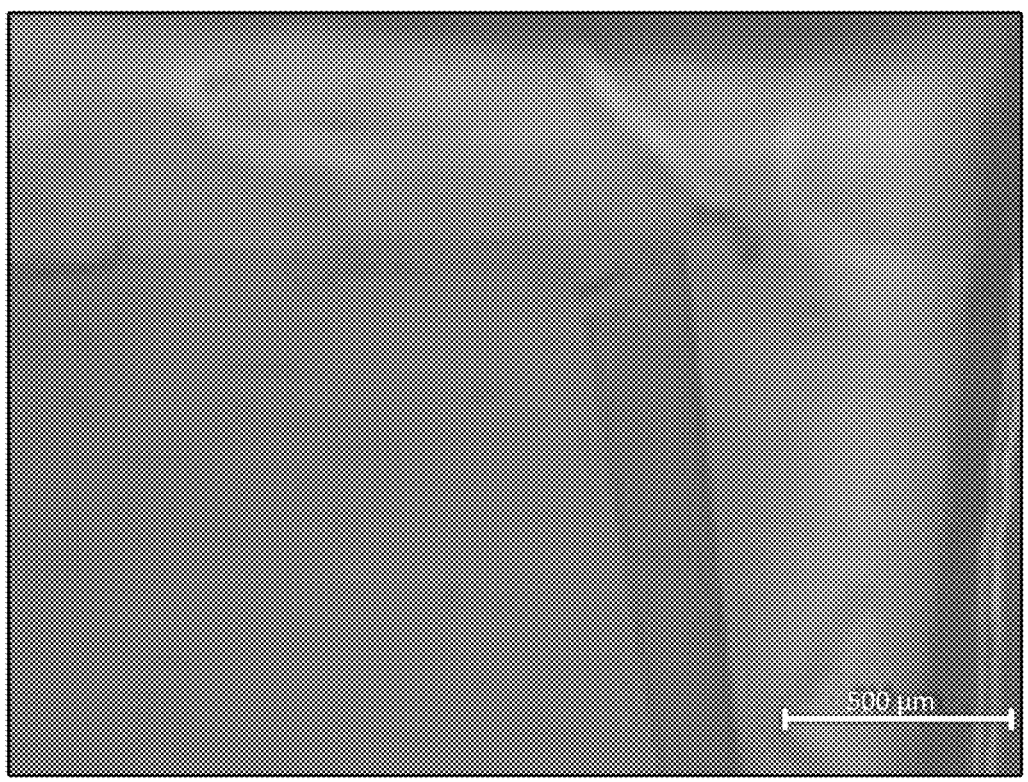
FIG. 6A is an image illustrating aspects of an as-fabricated free-standing ZrCuNiAl film in water.
Figure 6B:
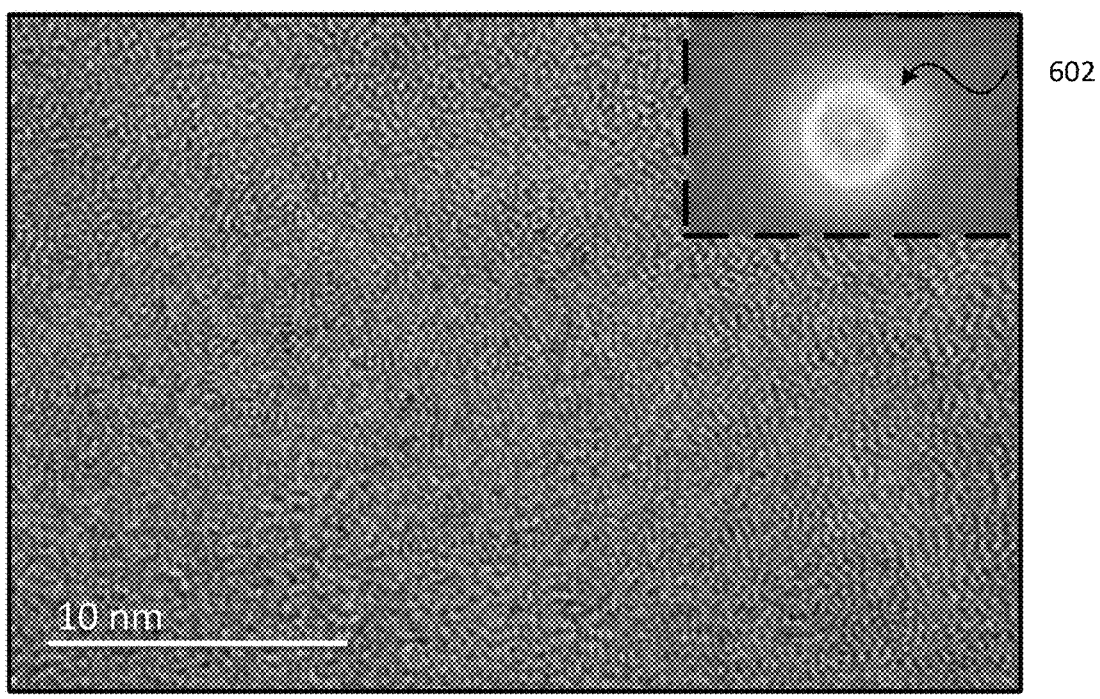
FIG. 6B is a high resolution TEM image of a free-standing ZrCuNiAl metallic glass film (inserted is corresponding FFT image)

FIGS. 6A and 6B illustrate aspects of a ZrCuNiAl film. In FIG. 6A, an image illustrating an as-fabricated free-standing ZrCuNiAl film in water is shown. The image shown in 6B is a high resolution TEM image of a free-standing ZrCuNiAl film, where highlight 602 illustrates the corresponding FFT image. As shown in FIGS. 2A-6B, the PSBEE techniques disclosed herein for forming nanomembranes enable chemically complex nanomembranes to be formed.

Figure 7:
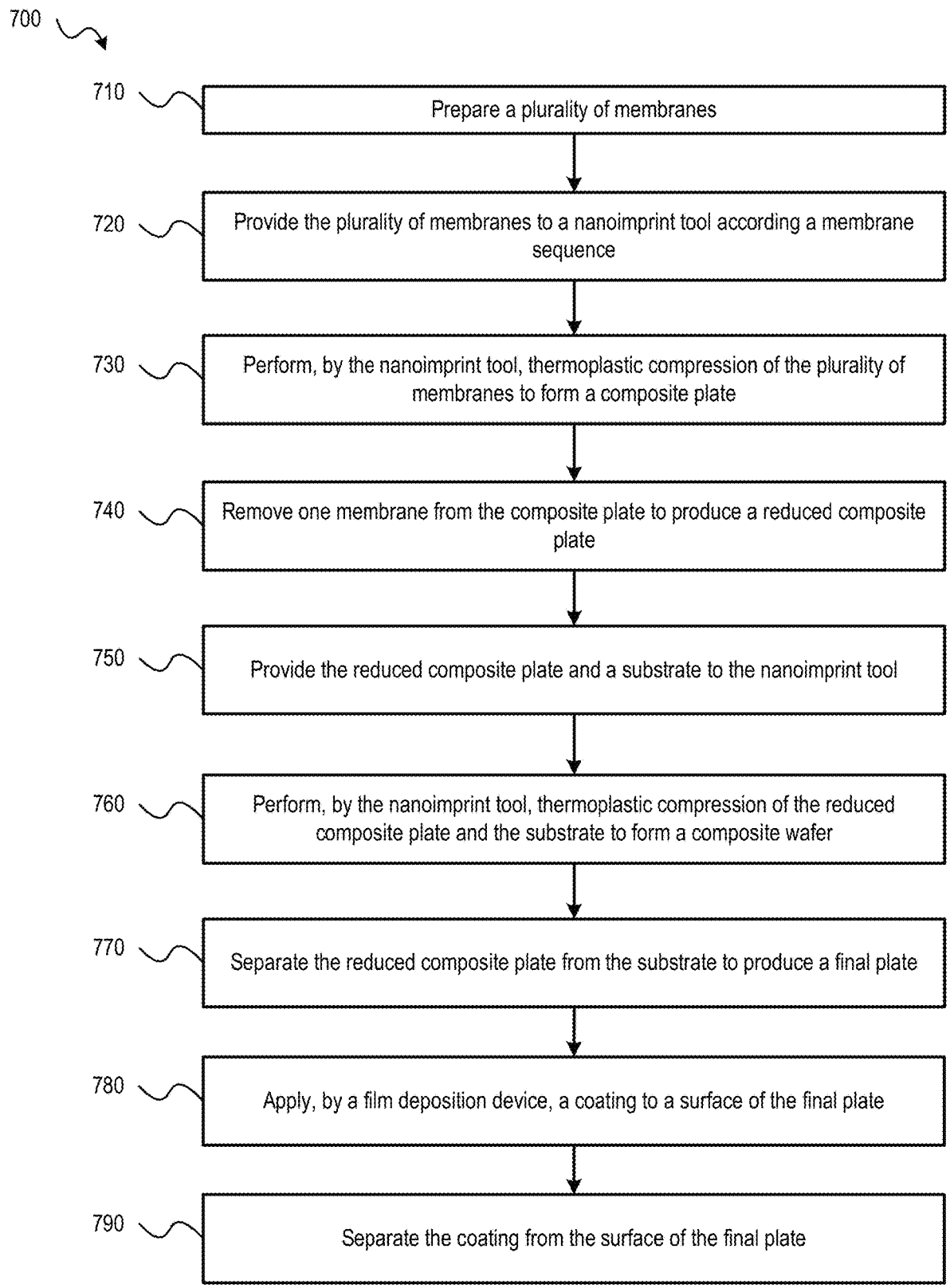
FIG. 7 is a flow diagram of a method for forming a nanomembrane in accordance with embodiments of the present disclosure.

Referring to FIG. 7, a flow diagram of a method for forming a nanomembrane in accordance with embodiments of the present disclosure is shown as a method 700. In an embodiment, operations of the method 700 may be performed by a system, such as the system 100 illustrated in FIG. 1. Additionally, all or a portion of the steps of the method 700 may be stored as instructions (e.g., the instructions 116 of FIG. 1) that, when executed by one or more processors (e.g., the one or more processors 112 of FIG. 1), cause the one or more processors to perform operations for forming nanomembranes in accordance with embodiments of the present disclosure. In addition to being performed under control or with the assistance of a computer-based fabrication process, embodiments of the method 700 may also be performed manually, such as by a technician working in a laboratory or other environment suitable for fabrication of nanomembranes in accordance with the present disclosure.

At step 710, the method 700 includes preparing a plurality of membranes. As described above, the plurality of membranes may include a polyvinyl alcohol (PVA) membrane, a polytetrafluoroethylene (PTFE) membrane, and one or more polyimide (PI) membranes. In an aspect, the water soluble substrate is the PVA membrane. At least one membrane of the plurality of membranes comprises a water soluble substrate, such as the PVA membrane. In an aspect, a shape of the one or more PI membranes may be smaller than the PVA membrane. At step 720, the method 700 includes providing the plurality of membranes to a nanoimprint tool according a membrane sequence. The membrane sequence may specify an order for providing the plurality of membranes to the nanoimprint tool. In an aspect, the order for providing the plurality of membranes to the nanoimprint tool may be specified from top to bottom and may indicate that the PTFE membrane is provided as a bottom layer, the PVA membrane is provided as a middle layer, and the PI layer is provided as a top layer. In an alternative aspect, the order for providing the plurality of membranes to the nanoimprint tool may be specified from bottom to top and may indicate that the PTFE membrane is provided as the bottom layer, the PVA membrane is provided as the middle layer, and the PI layer is provided as the top layer.

At step 730, the method 700 includes performing, by the nanoimprint tool, thermoplastic compression of the plurality of membranes to form a composite plate. In an aspect, the nanoimprint tool may perform the thermoplastic compression of the plurality of membranes under the control of another device, such as the controller 110 of FIG. 1. The thermoplastic compression of the plurality of membranes at step 730 may be performed for a threshold period of time at a predetermined temperature and pressure. The threshold period of time may be at least 10 seconds. The predetermined temperature may be between 130° C. and 200° C. The predetermined pressure may be between 3 and 8 bar. At step 740, the method 700 includes removing one membrane from the composite plate to produce a reduced composite plate. In an aspect, the one membrane removed from the composite plate may be the PTFE membrane.

At step 750, the method 700 includes providing the reduced composite plate and a substrate to the nanoimprint tool. The substrate may be a silicon wafer. At step 760, the method 700 includes performing, by the nanoimprint tool, thermoplastic compression of the reduced composite plate and the substrate to form a composite wafer. In an aspect, the nanoimprint tool may perform the thermoplastic compression of the reduced composite plate and the substrate under the control of another device, such as the controller 110 of FIG. 1. The thermoplastic compression of the reduced composite plate and the substrate performed at step 760 may be performed for a second threshold period of time at a second predetermined temperature and a second pressure. The second threshold period of time may be less than 3 minutes. The second predetermined temperature is between 110° C. and 150° C. In an aspect, the second predetermined temperature may be approximately 125° C. The second predetermined pressure may be between 1 and 8 bar.

At step 770, the method 700 includes separating the reduced composite plate from the substrate to produce a final plate. In an aspect, the method 700 may include determining whether scratches are present on the final plate. At step 780, the method 700 includes applying, by a film deposition device, a coating to a surface of the final plate. In an aspect, the film deposition device may apply the coating under the control of another device, such as the controller 110 of FIG. 1. In an aspect, the coating may be applied subsequent to the determination that the final plate is sufficiently free from scratches. The film deposition device may be a magnetron sputtering device, a thermal vapor deposition device, or some other device configured to apply a coating/film in accordance with aspects of the present disclosure.

At step 790, the method 700 includes separating the coating from the surface of the final plate. The separation of the coating from the surface of the final plate is facilitated, at least in part, by the water soluble substrate. For example, to separate the coating from the surface of the final plate, the final plate (having the surface to which the coating is applied) may be placed in deionized water and a portion of the final plate may absorb the deionized water, causing swelling and surface instability, such that the coating may be separated from the final plate, as described above. The portion of the final plate may be the water soluble substrate, such as the PVA membrane. As shown above, the method 700, whether performed manually or with a computer-controlled or computer-assisted process, enables fabrication of freestanding nanomembranes that are larger and/or more complex than previously available techniques.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a nanomembrane, the method comprising:
    preparing a plurality of membranes, wherein at least one membrane of the plurality of membranes comprises a water soluble substrate;
    providing the plurality of membranes to a nanoimprint tool according a membrane sequence;
    performing, by the nanoimprint tool, thermoplastic compression of the plurality of membranes to form a composite plate;
    removing one membrane from the composite plate to produce a reduced composite plate;
    providing the reduced composite plate and a substrate to the nanoimprint tool;
    performing, by the nanoimprint tool, thermoplastic compression of the reduced composite plate and the substrate to form a composite wafer;
    separating the reduced composite plate from the substrate to produce a final plate;
    applying, by a film deposition device, a coating to a surface of the final plate; and
    separating the coating from the surface of the final plate, wherein the separation of the coating from the surface of the final plate is facilitated, at least in part, by the water soluble substrate.

2. The method of claim 1, wherein the plurality of membranes comprises a polyvinyl alcohol (PVA) membrane, a polytetrafluoroethylene (PTFE) membrane, and one or more polyimide (PI) membranes, wherein the water soluble substrate comprises the PVA membrane.

3. The method of claim 2, where the membrane sequence specifies an order for providing the plurality of membranes to the nanoimprint tool, and wherein the order is specified from top to bottom.

4. The method of claim 3, wherein the order indicates that the PTFE membrane is provided as a bottom layer, the PVA membrane is provided as a middle layer, and the one or more PI membranes are provided as a top layer.

5. The method of claim 2, wherein a shape of the one or more PI membranes is smaller than the PVA membrane.

6. The method of claim 2, wherein the one membrane removed from the composite plate is the PTFE membrane.

7. The method of claim 2, wherein the substrate comprises a silicon wafer.

8. The method of claim 1, further comprising determining whether scratches are present on the final plate.

9. The method of claim 8, wherein the coating is applied subsequent to the determination that the final plate is sufficiently free from scratches.

10. The method of claim 8, wherein the film deposition device comprises a magnetron sputtering device or a thermal vapor deposition device.

11. The method of claim 1, wherein separating the coating from the surface of the final plate comprises placing the final plate having the surface to which the coating is applied in deionized water, and wherein a portion of the final plate absorbs the deionized water such that the coating is separated from the final plate.

12. The method of claim 11, wherein the portion of the portion of the final plate comprises a polyvinyl alcohol (PVA) membrane.

13. The method of claim 1, wherein the thermoplastic compression of the plurality of membranes to form the composite plate is performed for a threshold period of time at a predetermined temperature and pressure.

14. The method of claim 13, wherein the threshold period of time is at least 10 seconds.

15. The method of claim 13, wherein the predetermined temperature is between 130° C. and 200° C.

16. The method of claim 13, wherein the predetermined pressure is between 3 and 8 bar.

17. The method of claim 1, wherein the thermoplastic compression of the reduced composite plate and the substrate to form the composite wafer is performed for a threshold period of time at a predetermined temperature and pressure.

18. The method of claim 17, wherein the threshold period of time is less than 3 minutes.

19. The method of claim 17, wherein the predetermined temperature is approximately 150° C.

20. The method of claim 17, wherein the predetermined temperature is between 110° C. and 150° C.

21. The method of claim 17, wherein the predetermined pressure is between 1 and 8 bar.

22. A non-transitory computer-readable storage medium storing instructions that, when executed by one or more processors, cause the one or more processors to perform operations for fabricating a nanomembrane, the operations comprising:
    preparing a plurality of membranes, wherein at least one membrane of the plurality of membranes comprises a water soluble substrate;
    providing the plurality of membranes to a nanoimprint tool according a membrane sequence;
    controlling a nanoimprint tool to perform thermoplastic compression of the plurality of membranes to form a composite plate;
    removing one membrane from the composite plate to produce a reduced composite plate;
    providing the reduced composite plate and a substrate to the nanoimprint tool;
    controlling the nanoimprint tool to perform thermoplastic compression of the reduced composite plate and the substrate to form a composite wafer;
    removing the reduced composite plate from the composite wafer to produce a final plate;
    applying, by a film deposition device, a coating to a surface of the final plate; and
    separating the coating from the surface of the final plate, wherein the separation of the coating from the surface of the final plate is facilitated, at least in part, by the water soluble substrate.

* * * * *